United States Patent [19]
Valette

[11] Patent Number: 5,559,823
[45] Date of Patent: Sep. 24, 1996

[54] LASER WITH CONTROLLABLE BEAM DIRECTION

[75] Inventor: Serge Valette, Grenoble, France

[73] Assignee: Commissariat a l'Energie Atomique, Paris, France

[21] Appl. No.: 372,440

[22] Filed: Jan. 12, 1995

[30] Foreign Application Priority Data

Jan. 21, 1994 [FR] France ................................. 94 00645

[51] Int. Cl.$^6$ ............................................. H01S 3/08
[52] U.S. Cl. ..................... 372/92; 372/9; 372/99; 372/7; 372/101; 372/21; 372/11
[58] Field of Search ........................... 372/11, 92, 9, 372/21, 99, 7, 101

[56] References Cited

U.S. PATENT DOCUMENTS

| | | | |
|---|---|---|---|
| 3,992,681 | 11/1976 | Haun, Jr. et al. | |
| 4,246,548 | 1/1981 | Rutz | 372/99 |
| 4,953,166 | 8/1990 | Mooradian | 372/21 |
| 5,237,577 | 8/1993 | Keller et al. | 372/11 |
| 5,365,539 | 11/1994 | Mooradian | 372/21 |
| 5,388,114 | 2/1995 | Zarrabi et al. | 372/11 |
| 5,394,413 | 2/1995 | Zayhowski | 372/11 |

FOREIGN PATENT DOCUMENTS

| | | |
|---|---|---|
| 2535535 | 10/1982 | France . |
| 1566716 | 5/1980 | United Kingdom . |
| 94/04375 | of 0000 | WIPO . |
| 93/13564 | of 0000 | WIPO . |
| 92/03862 | 3/1992 | WIPO . |

OTHER PUBLICATIONS

Optics Letter —"Diode-pumped Microchip Lasers Electro optically Q Switched at High Pulse Repetition Rates", vol. 17, No. 17, Oct. 1992, New York, J. J. Zayhowski et al.
"Solid-State Laser Engineering"—'Q-Switches and Externa Switching Devices', W. Koechner, pp. 402–448.
Cleo Conference —"Diode-pumped Electro-optically Switched Mircochip Lasers", May 1992, J. J. Zayhowski al.
Exhibit A —Text filed at USPTO corresponding to FR 13564.
Exhibit B —U.S. Ser. No. 08/227,283, filed Apr. 1994, corresponding to FR 93 04375.
Optics Letters, Apr. 1, 1993, vol. 18, No. 7, pp. 511–512, Shouhuan Zhou et al., "Monolithic Self-Q-Switched Cr, Nd:YAG Laser".
Soviet Journal Of Quantum Electronics, 18 (1988) Jul., No. 7, pp. 832–833, V. M. Garmash et al., "Miniature Solid--State Laser With Semiconductor Pumping And Frequency Conversion, Emitting In The Ultraviolet Spectral Range".

Primary Examiner—Leon Scott, Jr.
Attorney, Agent, or Firm—Pearne, Gordon, McCoy & Granger

[57] ABSTRACT

A laser including a resonant cavity having a solid amplifier medium (1, 7, 8), an inlet mirror (2, 9, 10), an outlet mirror (3, 11, 12, 21), and an optical pumping device (5, 13, 16) to emit at least one pumping beam from the amplifier medium. The laser is operable to vary the direction of the pumping beam in the amplifier medium, and the cavity possesses a geometry enabling a laser beam to be generated, irrespective of the direction of the pumping beam.

20 Claims, 6 Drawing Sheets

1

LASER WITH CONTROLLABLE BEAM DIRECTION

FIELD OF THE INVENTION

The present invention concerns a laser with controllable beam direction.

It can be applied in optics, physics, optical telecommunications, optical detection (LIDAR), the machining of materials, etc.

BACKGROUND OF THE INVENTION

Although the invention is not limited to microchip lasers, the invention shall be described in this particular context to demonstrate its particular characteristics.

Microlasers or microchip lasers constitute a new family of lasers having a large number of advantages. A microchip laser is formed of a generally short (ranging typically from 100 µm to several millimeters) amplifier medium framed by two mirrors. This medium is optically pumped by a laser beam generally originating from a laser diode. The power of this diode generally is between about one hundred to several thousands of milliwatts.

The yield of microchip lasers is about between 20 and 30% so that they emit powers of about several tens of milliwatts continuously, indeed several hundreds of milliwatts.

Compared with individual laser diodes, they possess a large number of advantages.

Accordingly, they possess excellent spatial and time coherence converters.

Secondly, owing to the fact that clearly defined energy levels are involved for laser emission and not emission bands as in semiconductive laser diodes, the characteristics of the emission of a solid laser are less dependent on the environment and in particular the temperature than that of a laser diode.

One advantage of this type of laser is their collective method of manufacture. It fact, it is only necessary to coat an amplifier material plate with suitable reflecting films and cut the microchip lasers in their entirety. Since it is possible to start with one plate a few centimeters in diameter and since only a square section of one millimeter suffices to produce a microchip laser, several tens or hundreds of microchip lasers can be embodied in a single cycle of technical operations.

Thus, the production cost of these components is relatively low.

The lasers operate with a continuous pumping beam emitting a continuous luminous beam. However, one advantage of solid lasers pumped by laser diodes is that they use amplifier materials whose radiative lifetime is relatively long (from 100 µm to 100 ms) compared with the lifetimes involved in laser diodes, (which is one nanosecond). It is therefore possible to produce Q-Switch lasers capable of emitting short light pulses (from one fraction of one nanosecond to a few dozen nanoseconds) by storing the energy generated by optical pumping for a period of about the radiative lifetime of the material and by restoring all this energy during a very short period.

This type of short and intense pulse may be obtained with a single laser diode, having regard to the extremely short radiative lifetime periods observed in semiconductors (of a few nanoseconds). These short lifetime periods limit the possible storage period and thus reduce the advantage of these solutions.

Owing to the above-mentioned reasons, microchip lasers increasingly appear as light sources complementary to laser diodes, and are also essential.

Amongst the applications aimed at, the embodiment of microlidars for detecting obstacles seems to about to assume particular significance.

The principles involved may be multiple but they are still based on firstly the time taken by a laser beam to cover the return distance between the emission point, secondly the obstacle which sends back (generally by transmission) one portion of the luminous beam towards the detector, and the thirdly the latter. So as to do this, it is possible to use phase measurements associated with frequency ramps (heterodyne detection) or flight time measurements of an extremely short laser pulse. In the first case, the laser used emits continuously and in the second case, it emits in pulses.

Indeed, there exists many variants concerning these two well-known operating methods.

As regards applications within the motor vehicle industry, for example, this detection of obstacles must, if possible, be carried out, not only in one direction, but in several directions at the same time so as to have a true "picture" of the obstacles situated in front of the vehicle.

This requires the use of a network of microlidars, which requires a complex mounting with mechanical means, which is likely to be subject to deformations owing to the acceleration or extensive movement which may be carried by a vehicle on which this type of system is carried.

Thus, a simpler type of system is needed to avoid the presence of mechanical parts.

Moreover, also required is a system able to incorporate the Q-switching means in a simple form making it possible to retain the compact structure of the microchip laser, avoid as much as possible introducing optical glue and having to carry out optical adjustment during use and avoiding the use of the standard codoping solution unable to adjust the properties of the laser material and a saturable absorbent.

As far as we know, this type of system has not yet been proposed, neither as regards the general context of lasers nor that of the particular context of microchip lasers.

SUMMARY OF THE INVENTION

The precise object of the present invention is to satisfy this requirement.

More particularly, the object of the invention is to provide a microchip laser comprising a Q-switch cavity having a solid amplifier medium, an inlet mirror and an outlet mirror, optical means for emitting at least one pumping beam of the amplifier medium, wherein it comprises a thin absorbent saturable film placed in the cavity, means to vary the direction of the pumping beam in the amplifier medium and wherein the cavity possesses a geometry able to generate a laser beam, irrespective of the direction of the pumping beam.

The pumping means may be formed of a matrix of light sources able to be controlled individually or collectively. They also may be formed of at least one light source and means to physically move this source.

According to one embodiment of the invention, at least the inlet mirror is a spherical mirror and the means to vary the direction of the pumping beam comprise a focusing lens situated on the path of the pumping beam so that the back focus of this lens is approximately merged with the center of curvature of the spherical mirror.

More specifically, the second mirror is spherical and the centers of curvature of the two mirrors are approximately merged.

According to one variant of this preferred embodiment of the invention, the outlet mirror is flat or slightly concave or slightly convex.

The pumping means may also be formed of a small bar of light sources able to be controlled individually or collectively.

According to a second embodiment of the invention, the inlet mirror is a cylindrical mirror and the means to vary the direction of the pumping beam comprise a cylindrical focusing lens situated on the path of the pumping beam so that the two axes of cylindrical symmetry of respectively the inlet mirror and the lens are disposed along a given direction and that inside any plane perpendicular to this direction, the image focal point of the lens is approximately merged with the center of curvature of the mirror inside this same plane.

More specifically, the outlet mirror also possesses cylindrical symmetry.

According to one variant of this second embodiment of the invention, the outlet mirror is flat or slightly concave or slightly convex, the concavity or convexity then having cylindrical symmetry with an axis parallel to the cylindrical axis of symmetry of the inlet mirror.

BRIEF DESCRIPTION OF THE DRAWINGS

The characteristics and advantages of the invention shall appear more readily from a reading of the following description relating to the embodiment examples given by way of nonrestrictive explanation and with reference to the accompanying drawings on which.

DETAILED DESCRIPTION OF THE PREFERRED EMBODIMENTS

Figure 1:
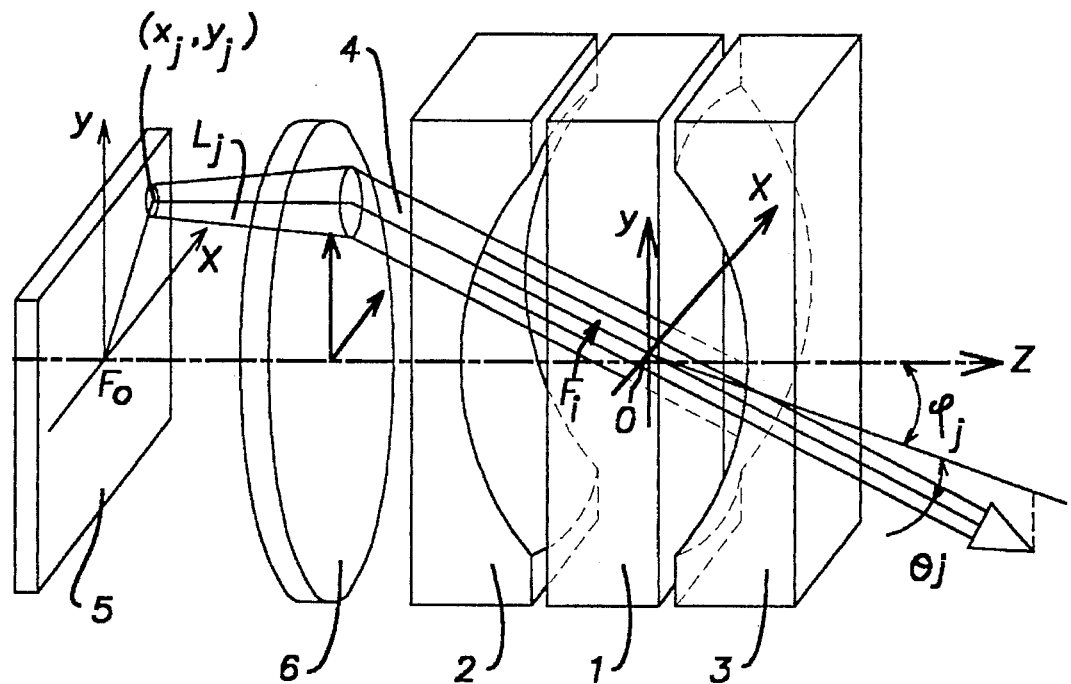
FIG. 1 shows a perspective view of a first preferred embodiment of the invention.
Figure 2:
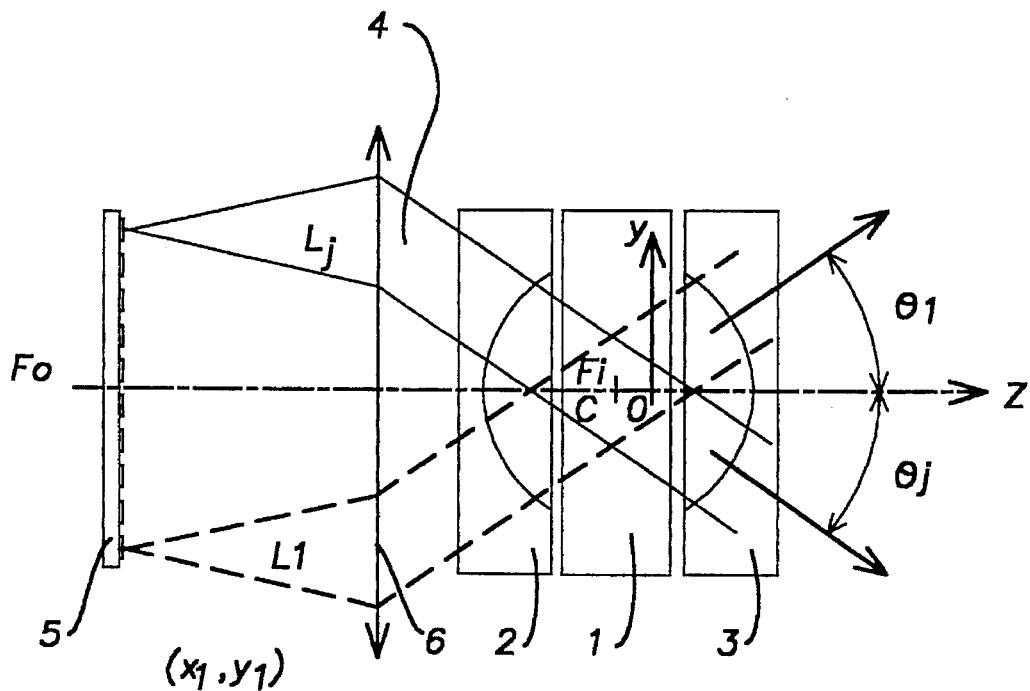
FIG. 2 shows a sectional view of a first preferred embodiment of the invention.

A perspective view of a first preferred embodiment of the invention is shown on FIG. 1 and as a section on FIG. 2 where the reference 1 denotes a laser amplifier medium, such as a solid.

The material constituting the amplifier medium 1 shall conventionally be doped with neodyme (Nd) for a laser emission around 106 μm. This material could be selected from one of the following substances: YAG ($Y_3 Al_5 O_{12}$), LMA ($LaMgAl_{11} O_{19}$), $YVO_4$, YSO ($Y_2 SiO_5$), YLF ($YLiF_4$) or $GdVO_4$, etc.

For emissions on other wavelengths, different materials and dopers shall be chosen. Generally speaking, the active ions are selected from: Nd for an emission around 1.06 μm, Er or an erbium-ytterbium codoping Er+Yb for an emission around 1.5 μm, Tm or Ho or a thulium and holmium codoping (Tm-Ho) for an emission around 2 μm.

A further decisive parameter is the thickness e of the active medium. It conditions the characteristics of the microchip laser as the absorption of the pump laser shall be that much higher when the thickness e is large and since it conditions the spectral distribution of the modes of the cavity. In practice, the thickness e shall vary between 100 μm and 15 mm.

In the case of microchip lasers, the production of the laser amplifier medium shall comprise three stages:

choice of the basic material constituting the crystal and the choice of an active ion, conditioning of the selected laser crystal: it is cut into plates having a thickness of between 0.1 and 15 mm, honing and polishing of the plates so as to firstly lift up the superficial strain-hardened film due to the cut, and secondly bring the thickness of the plates to a thickness slightly larger than the specification of the microchip laser.

The honed plates made to approximate the final thickness are polished on the two faces with optical quality.

The cutting, honing and polishing are effected with established methods by using known machines.

The method described is one allowing for low cost series production.

On FIGS. 1 and 2, the amplifier medium is framed by two mirrors 2 and 3, the mirror 2 being an inlet mirror for the pumping beam 4 of the amplifier medium 1.

According to this first preferred embodiment, the cavity possesses a symmetry of revolution with respect to an axis z. If an original point 0 is selected arbitrarily on the axis z and a system of axes Oxyz in which basic vectors have the same length, the inclination of the beam 4 in the amplifier medium is defined with respect to the system of axes Oxyz by two angles φj and θj (see FIGS. 1 and 2): θj corresponds to the angle between the propagation angle of the pumping beam and the plane xOz and φj corresponds to the angle between the projection of this propagation axis in the plane xOz and the axis z.

The reference 5 denotes a matrix of light sources able to be addressed sequentially either individually or collectively. These sources may be selected from the usual optical pumping sources of lasers or microchip lasers media, such as conventional laser diodes, electroluminescent diodes (for microchip lasers able to operate at extremely low thresholds) or vertical cavity semiconductive microchip lasers (VCSML).

If conventional laser diodes are used, matrixes of this type of diode already exist commercially and commonly known under the term "stack". Nevertheless, this type of matrix needs to be adapted as these matrixes are still sold in a version where all the diodes of the matrix are Q-switched simultaneously.

The light source matrix 5 shall preferably be situated on the first focal point Fo of a focusing lens 6 whose second focal point Fi is situated either in the middle of the amplifier medium 1 or possibly inside the means for Q-switching the cavity when these means are incorporated inside the amplifier medium, as explained subsequently.

Secondly, according to this first preferred embodiment of the invention, it is possible to select a cavity formed by two spherical mirrors whose centers of curvature are merged or approximately merged with the second focal point Fi but whose radii of curvature are not necessarily equal.

Thus, the selection or addressing of a source marked by its coordinates (Xj, yj) in a marking $(F_o, x, y)$ of the matrix 5 makes it possible to obtain a beam Lj, which is deviated by the lens 6 in the direction of the amplifier medium and which passes through the second focal point Fi. If in addition Fi is merged with the center of curvature common to each mirror, the beam shall be able to go backward and forwards inside the cavity and oscillate along a direction defined by the angles $\phi j$ and $\theta j$ which generates a laser beam along this same direction, irrespective of the angles $\phi j$ and $\theta j$.

The angles $\phi j$ and $\theta j$ depend on the position (xj,yj) of the selected source in the plane of the matrix 5 and the focal distance f of the lens 6. More specifically:

$$tg\theta j = \frac{Yj}{f} \text{ and } tg\phi j = \frac{xj}{f}$$

By selecting for example a point $(X_1, Y_1)$ (see FIG. 2), a beam is obtained defined by ($\phi 1$ and $\theta 1$):

$$tg\theta 1 = \frac{y1}{f} \text{ and } tg\phi 1 = \frac{X1}{f}$$

and a laser emission along this second direction ($\phi 1$, $\theta 1$).

The dynamics of the system are defined by:

$$tg\theta j\max = \frac{Yj\max}{f} \text{ and } tg\phi j\max = \frac{xj\max}{f}$$

Yjmax and Xjmax being the possible maximum coordinates for a source inside the plane $(F_o, x, y)$.

For example, a matrix formed of a set of vertical cavity microchip lasers has been embodied, thus defining pixels with a size of 30 µm×30 µm; as the power emitted per pixel is about 10 mW, a zone of 300 µm×300 µm emits a power of about one Watt, which is generally sufficient for pumping a microchip laser. By taking Xjmax=1 mm=Yjmax and a focal length=4 mm:

θjmax=12° and φjmax=12°

Figure 3:
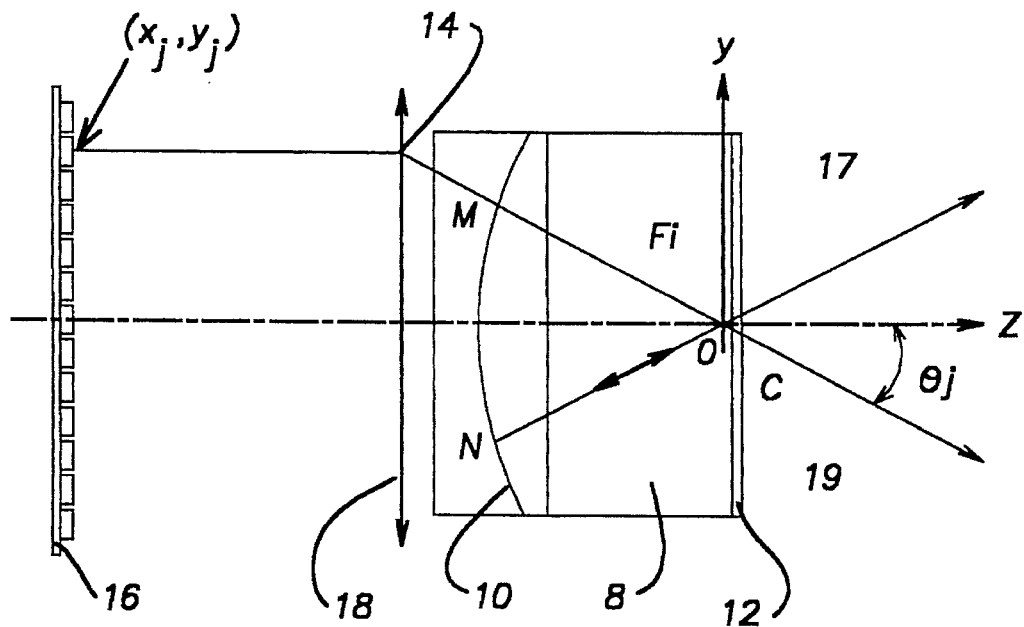
FIG. 3 shows a sectional view of one variant of the first preferred embodiment of the invention.

One variant of this first preferred embodiment of the invention is shown on FIG. 3. The reference 8 denotes here the amplifier medium, 10 and 12 the inlet and outlet mirrors of the pumping beam 14, the reference 16 a matrix of light sources (here again conventional laser diodes), electroluminescent or vertical cavity semiconductive microchip laser diodes, and the reference 18 a convergent lens. The cavity still has its symmetry of revolution around an axis Oz. It is formed of a curved mirror, for example a spherical mirror at the inlet and a flat mirror or slightly concave or convex at the outlet. The center of curvature C of the inlet mirror is located at the level of a plane tangent to the outlet mirror which is perpendicular to Oz, the second focal point Fi of the lens 18 being merged or approximately merged with C, as in the preceding case.

In this variant, the pumping beam traverses the mirror 10 at a point M, penetrates into the active laser medium 8 and spreads in the direction of the point Fi where it is reflected towards the spherical mirror but in a direction of a point N symmetrical with the point M with respect to the axis of revolution Oz. At this point, the beam is reflected towards Fi and then to the point M and so on. Thus, here again an intracavity oscillation is obtained, regardless of the angles j and θj. But the final result is generally the emission of two laser beams 17 and 19 which are symmetrical with respect to the axis Oz.

Here again, the inclination (θj, φj) of the two beams inside a mark (Oxyz) (where Ox is perpendicular to the plane of FIG. 3) shall depend on the selected source point in the matrix 16 and the geometrical and optical characteristics of the components.

When attempting to detect an obstacle, with this variant it is possible to obtain information originating from two different directions which are symmetrical with respect to the optical axis of the system.

In the two cases described above, the addressing of the various sources inside the matrix (5, 16) shall be effected by conventional electronic means known to experts in this field. This addressing may be controlled by a microprocessor.

Thus, a laser beam is obtained able to be orientated inside a ellipsoid cone whose opening shall be defined by the size of the matrix and the characteristics of the optical elements (in particular the focal distance).

The matrix (5, 16) could be replaced by a single light source moved by an electromechanical control system, such as an arm activated by an electric motor controlled by a microprocessor.

According to a second preferred embodiment of the invention, it is possible to embody a system in which each mirror exhibits a finite bend inside the plane yOz, but no bend in the plane xOz. The unit then no longer possesses the symmetry of revolution around Oz but has a plane symmetry with respect to the plane xOz (the point O is then selected arbitrarily in the plane of symmetry). This is the case for cylindrical mirrors, especially those having a circular straight section or those with the shape of an arc of a circle, the focusing lens then being also cylindrical and especially having a circular straight section or arc of a circle section. It is then essential that in each plane parallel to yOz, the focal point Fi and the center of curvature of each mirror are merged or approximately merged. This means that the three axes of cylindrical symmetry are parallel to one another and situated inside the plane xOz, but the curves of the two mirrors may differ from each other.

Figure 4:
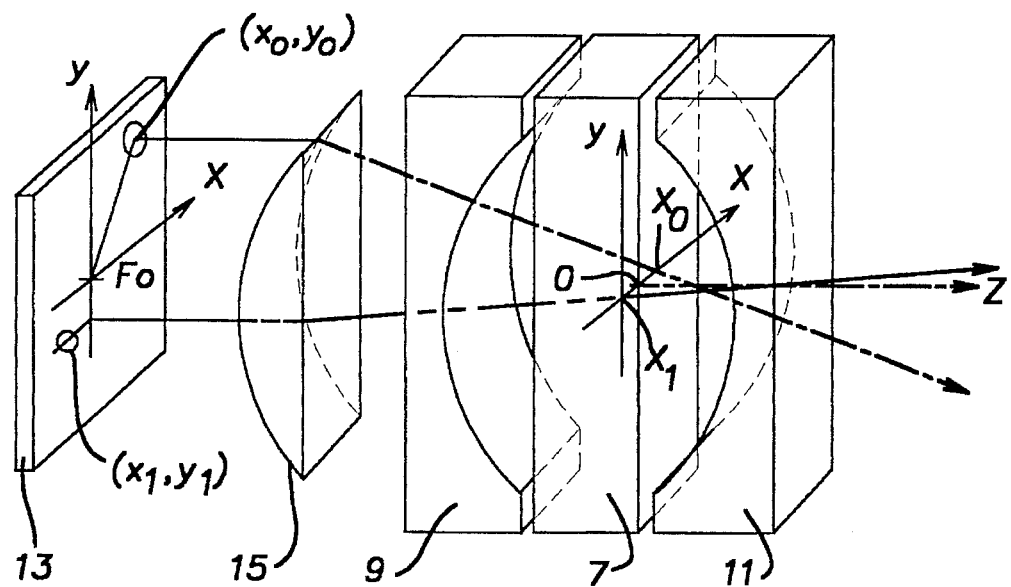
FIG. 4 shows a second preferred embodiment of the invention.

This second preferred embodiment is shown in perspective on FIG. 4 where the reference 7 denotes the active solid medium of the laser, 9 and 11 the inlet and outlet mirrors, such as circular straight section or arc of a circle mirrors, the reference 13 a matrix of light sources and 15 a convergent lens, such as a circular straight section or arc of a circle lens. The result obtained is a laser beam with an angle θj able to be orientated inside a vertical plane and with a variable abscissa xj. The resultant pumping beam and laser beam for a selected element of the matrix 13 are all contained inside a vertical plane (plane parallel to yOz). If two elements (xj,yj) and (xj, y'j) of the matrix are addressed simultaneously with these two elements having the same abscissa xj in the plane of the matrix 13, all the beams shall again define a single vertical plane parallel to yOz and the inclination of each laser beam shall respectively be θj and θj' with $$tg\theta j = \frac{yi}{f} \text{ and } tg\theta j' = \frac{yj'}{f}$$

If two elements with different abscissae xo and x1 are addressed, two pumping beam/laser beam units are obtained defining two parallel vertical planes offset by the difference xo–x1, as shown on FIG. 4.

According to one variant (not shown), it is also possible to replace the matrix of diodes by a small bar of light sources disposed along an axis parallel to Foy (see FIG. 4) able to be controlled individually or collectively. Then a laser beam is obtained contained in a plane parallel to yOz, the orientation θj being the only one able to be varied.

Figure 5:
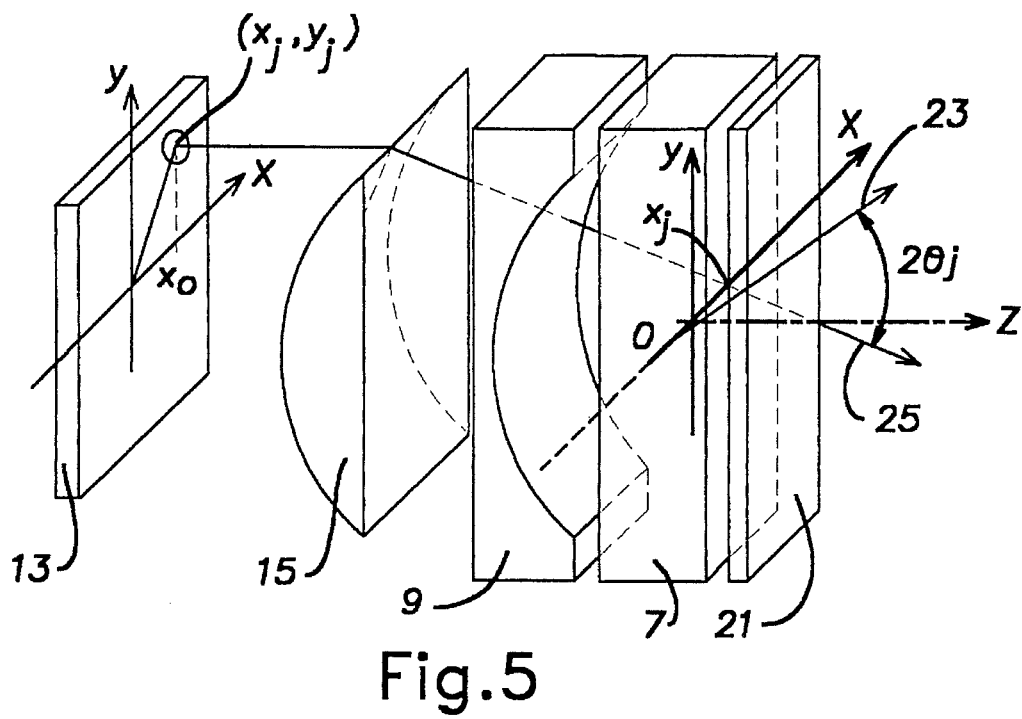
FIG. 5 shows a variant of the second preferred embodiment of the invention.

According to one variant of this second embodiment shown on FIG. 5, the cavity still possesses plane symmetry (the plane of symmetry being merged with xOz), the mirror 9 having a finite curve in the plane yOz but no curve in the plane xOz. The inlet mirror 9 may be cylindrical, as well as the focusing lens 15, the axis of each cylinder being parallel to the axis Ox (see FIG. 5).

The outlet mirror 21 is flat or possibly slightly convex or concave, but in this case, there is only concavity or convexity in the plane yOz and in any vertical plane parallel to it so as to observe the plane symmetry with respect to the plane xOz. Thus, the mirror 21 is a mirror with an axis parallel to the preceding ones and situated inside the plane xOz.

If in any plane parallel to yOz, the center of curvature C of the inlet mirror and the second focal point Fi of the lens 15 are merged or approximately merged and located at the level of the plane tangent to the outlet mirror, two laser beams 23 and 25 are obtained for each element (xj, yj) addressed in the matrix 13, said beams being symmetrical with respect to the plane xOz and contained in the plane with the equation x=xj in a mark (Oxyz), the angle 2θj (FIG. 5) being variable, as well as the abscissa xj on the axis Ox.

Here again, it is possible to replace the matrix by a small bar of light sources disposed parallel to Foy and having the abscissa xi and able to be controlled individually or collectively and thus obtain for each element (xi, yj) addressed in the small bar two laser beams symmetrical with respect to the plane xOz and contained in the plane with the equation x=xi, the angle θj varying as a function of the ordinate yj on the axis (Foy).

Similarly as in the first embodiment, it is possible to replace the source matrix 13 (or small bar) by a single source whose spatial position is controlled by mechanical or electronic means.

In the case of conventional lasers (as opposed to microchip lasers), the embodiment method may be one of the normal methods for embodying mirrors known to experts in this particular field.

Figure 6A:
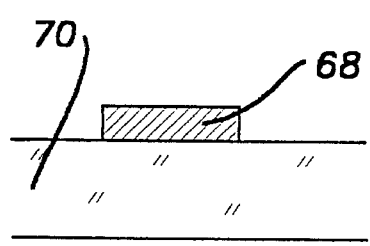
FIGS. 6a to 6d show various stages of a method for embodying spherical mirrors for a microchip laser conforming to the invention.
Figure 6B:
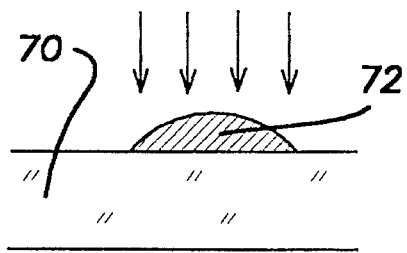

In order to form mirrors in the case of microchip lasers, it is possible to use a "creep or flow" technique. Thus, as shown on FIG. 6a, a film of a deformable photosensitive material, such as resin, is disposed etched in the form of blocks 68 (FIG. 6a) on a wall 70 transparent to the wavelength of the laser and made of silica. These blocks may have any particular shape, such as square, circular or elliptic. These blocks are heated and by creeping take on the lenticular shape 72 shown on FIG. 6b and are used as masks.

Figure 6C:
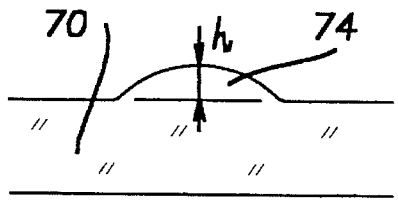

Then the wall 70 with a thickness h is etched (dry or humid etching) through the masks 72 which, once the masks have been eliminated, leaves microlenses 74 with a thickness h (FIG. 6c). For the beams with a curve of between 1 and 10 mm for lens diameters of between 100 and 500 μm, the height h is between about 0.1 μm and 30 μm.

Figure 6D:
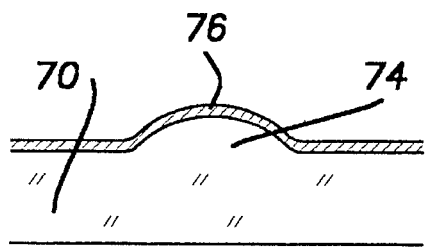

These microlenses are coated with one or several films 76 reflecting on the wavelength of the laser beam (FIG. 6d), for example by placing dielectric multifilms.

As described above, this method makes it possible to produce spherical "micromirrors". It can also be used for the production of cylindrical mirrors. But in this case, it is essential to initially ensure placing the deformable photosensitive material, not in the form of blocks (as on FIG. 6a), but in the form of strips. It is also essential to lay down a strip having a sufficient length so as to avoid being damaged by the effects of the edges inevitably occuring at the ends of the strip during creeping and which affect the cylindrical symmetry.

In all these cases, this "creeping or flowing" method allows for a production of "micromirrors" on a large scale and here again reduces production costs.

Another forming method makes it possible to obtain mirrors placed on recessed shapes, such as the mirrors 2 and 3 shown on FIGS. 1 and 2. In order to achieve this, it is initially possible to embody the shape of the convex mirror by means of creep. Then, reflecting films are molded and placed on the molded shape obtained. Here again, the method is applicable for large scale production.

All the embodiments and variants described are able to be Q-switch-operated by incorporating inside the cavity a saturable absorbent material or electro-optical or acousto-optical means. All these means can be used with a conventional laser or with a microchip laser.

Their use with a conventional laser is known. Reference may be made in this respect to the work by W. Koechner entitled "Solid-State Laser Engineering" published by Spinger Verlag and in particular the chapter entitled "Q-Switches and External Switching Devices", p. 402–448.

In the case of microchip lasers, Q-switched microchip lasers have recently appeared using electro-optical means. In the reports of the CLEO Conference held in the USA in May 1992, J. J. ZAYHOWSKI and al. describes a Q-switched microchip laser (CM17 communication entitled "Diode-pumped Electro-optically Q-Switched Microchip Lasers") constituted by a Nd:YAG microbar 532 μm, long joined side by side to a LiTaO3 microbar 904 μm long. Electrodes are placed on the two faces perpendicular to the axis C of the LiTaO3 crystal, the axis C being perpendicular to the general axis of the laser. Pulses of 600 V with a period of 100 ns are applied to the electrodes and Q-switched luminous pulses are obtained lasting less than 2 ns. In order to embody this type of electro-optical cell in the case of a microchip laser, reference may be made to the article by ZAYHOWSKI and al.

Figure 7:
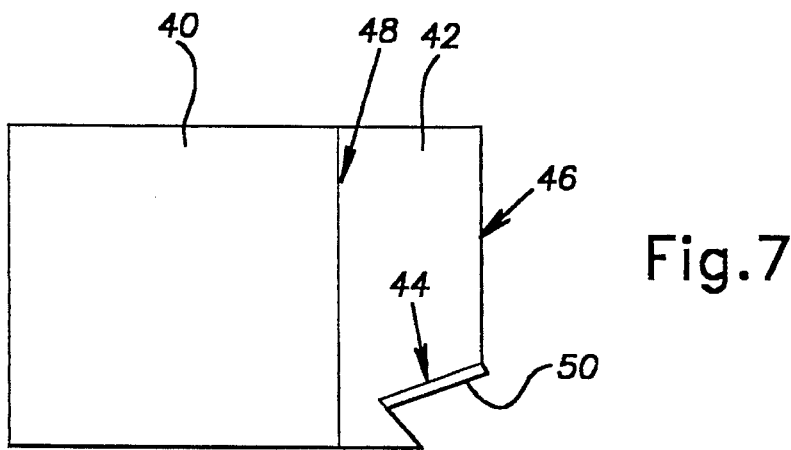
FIG. 7 shows the active medium of a microlaser with an acousto-optical Q-switching cell.

One known type of microchip laser is one Q-switched by electro-acoustical device. This microchip laser is described in the patent application FR-93 04375 filed on 14 Apr. 1993 and the method for producing the electro-acoustical device. One portion of this microchip laser is shown on FIG. 7 also showing a laser amplifier block 40 assembled with an acousto-optical Q-switching microcell. This microcell includes a block 42 having one etched face 44 which is a crystallographic plane, as well as one front face 46 and one rear face 48 both orientated with respect to this plane. Finally, piezo-electric means 50 to generate an acoustic wave are placed on the etched face.

As regards the material constituting the block 42, from the materials satisfying the following characteristics, it would be preferable to select:

machinable materials with high thicknesses (several hundreds of microns) with appropriate methods ensuring excellent surface quality; this in particular concerns anisotropic attack techniques;

these materials should exhibit low acoustic losses at high frequencies (50 dB/ (cm.Ghz appears to be an upper limit: this corresponds to about 1 dB of losses on 1 mm of propagation at 500 MHz which shall be the order of magnitude of the acoustic frequencies used);

transparence should be suitable for the emission wavelengths of microchip lasers and ideally a wavelength transparence beyond 0.9 to 1 μm is sought; however, many applications towards 1.5 μm and between 2 and 3 μm are currently targetted.

The materials satisfying these conditions are in particular silicon Si, germanium Ge, gallium arsenide GaAs, indium phosphide InP and gallum phosphide GaP. They are all available in suitable qualities in the natural environment and may be chemically machined with known types of attack solutions and with the highly dependent attack speeds of crystalline planes.

Advantageously, the method for embodying an acousto-optical Q-switching microcell 42 exploits the properties of the anisotropic etching, such as the one obtained by preferential chemical attack. This here concerns an etching method based on the etching speed difference between various crystallographic planes of a given material for certain attack agents.

Generally speaking, the attack speed is extremely slow along one of the crystalline planes (standard plane (111) for example) and extremely fast along the others.

Thus, particular etching geometries are obtained arising from this property and whose shape is imposed by the angular configurations of the slow attack planes and the initial orientation of the crystals.

It is also possible to carry out this method using silicon whose properties in this respect are well known. But highly similar configurations may be obtained with germanium or with composed semiconductors, such as GaAs or InP or others. In this latter case, it is however essential to be careful of the presence of two types of atomic planes.

So as to implement this etching at great depths, it is also necessary to have a masking material sufficiently resistant to the attack agent.

Figure 8:
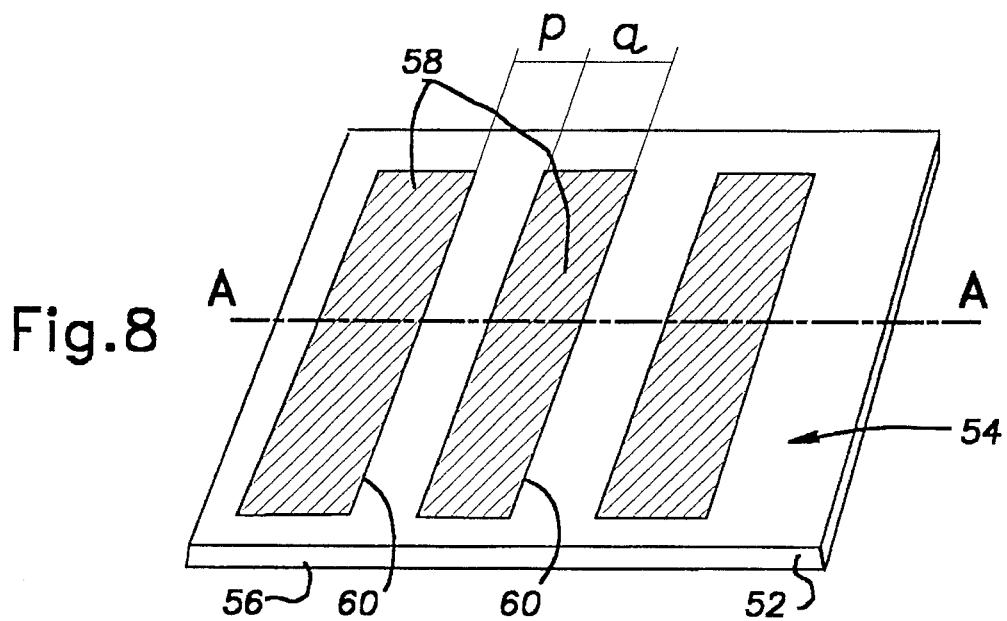
FIG. 8 shows a first stage for embodying an acousto-optical plate.

More specifically, in order to embody an acousto-optical cell (or rather a plurality of these cells as the method allows for a large scale production), as shown on FIG. 8, a plate 52 is firstly used made of a suitably selected crystalline material (see the criteria above) with appropriate orientation with one front face 54 and one rear face 56. This material possesses crystallographic planes. One of these planes cuts the front face 54 along a certain direction. Then placed on the front face 54 is a mask formed of a matrix of patterns 58 (rectangular strips with a width a and separated by a distance p) having at least one edge 60 parallel to the direction along which the selected crystallographic plane cuts the front face 54.

FIGS. 9a–d shows sectional views of several stages during etching of the plate 52 in the case where this plate is made of silicon with one front face 54 orientated along the crystallographic plane (100). In this case, the mask 58 may be made of silica SiO2 or silicon nitride Si3N4.

Figure 9A:
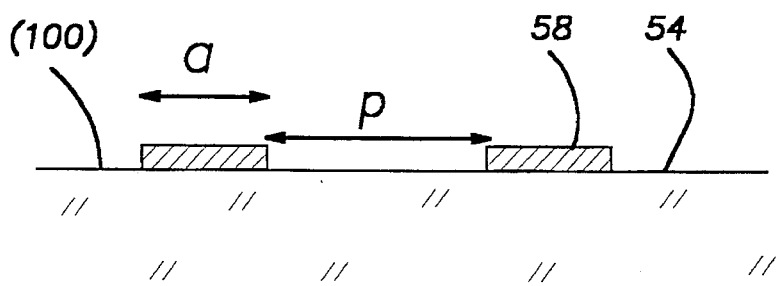
FIGS. 9a to 9d show examples of oblique profiles able to be obtained by anisotropic etching on a surface orientation plate (100) for embodying an acousto-optical plate.
Figure 9B:
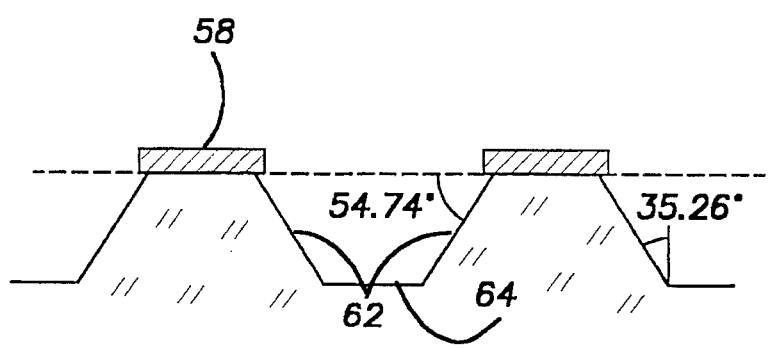

FIG. 9a is a section of the plate with the patterns 58 of the mask.

After a certain attack time (FIG. 9b) (such as a preferential chemical attack using, for example, a mixture of a base and a alcohol (KOH-methanol or similar substance)), the horizontal (or surface) plane (100) has been etched much deeper than the standard planes (111). The standard planes (111) are defined by the planes (111) and 111) which are situated in any disposition on both sides of the normal line to the surface plane. These planes are orientated obliquely and given the reference 62. The angles between these various planes and the surface plane are 54.74°. The angle of the planes 62 with respect to the normal line to the plate is 35.26°.

Figure 9C:
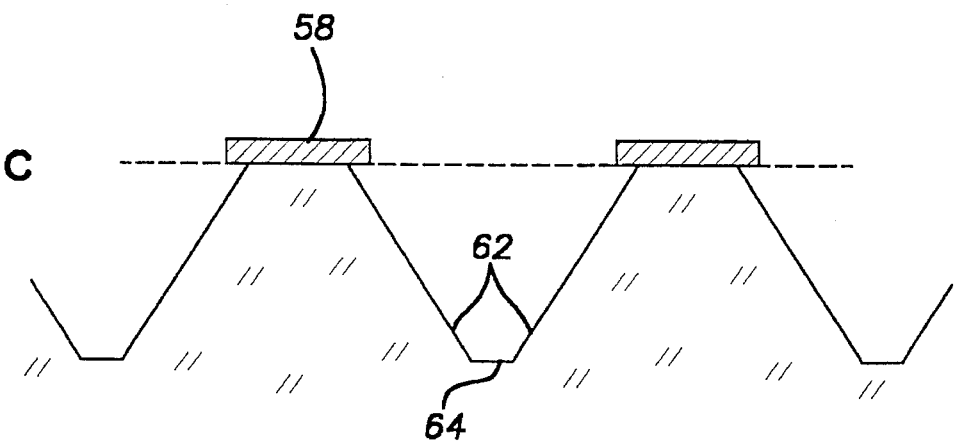

After an even longer attack time, the bottom 64 becomes even smaller (FIG. 9c).

Figure 9D:
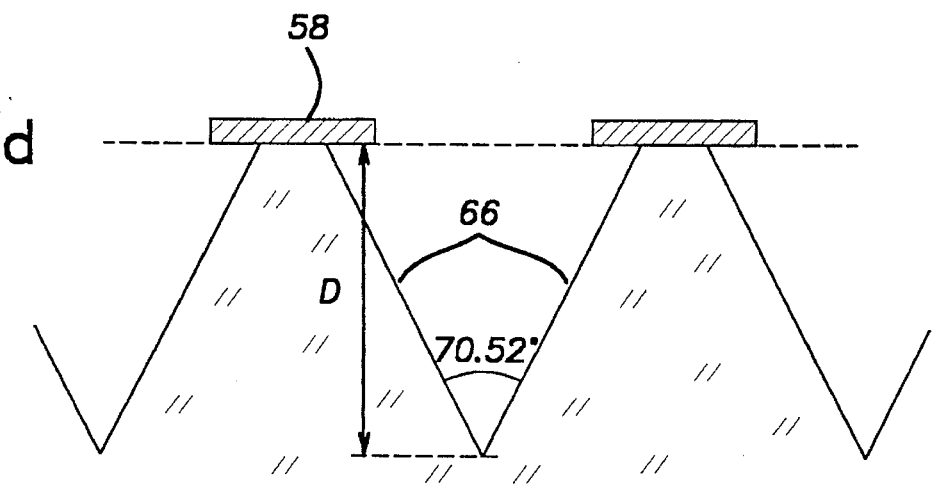

After a certain time, the bottom has disappeared. The two planes (111) and (111) meet and form a V profile reference 66 forming an angle of 70.52° (FIG. 9d).

The depth D then evolves slowly as the attack speed of the standard planes (111) is extremely slow (not not nil).

The slow attack planes (111) or (111) are those which are to be used as a support for the piezoelectric means which could include a piezoelectric film placed between two electrodes.

It is possible to obtain various etching geometries according to the angle the front face makes with the plane (111), the distance p between two adjacent patterns of the matrix 58 (FIGS. 8 and 9a ) and the attack time.

An expert in this field shall know the angle according to the operating conditions selected for the acousto-optical cell (Bragg process, Raman-Nath process).

The French patent application FR-93 13564 describes a microchip laser able to be passive Q-switched by a saturable absorbent and the method for forming this saturable absorbent. According to this method, a saturable absorbent in the form of a thin film is placed directly on a laser amplifier medium. Depending on the placing method, the composition of the thin film shall be different.

According to a first placing mode, the thin film is composed of an organic colorant dissolved in a polymer solvent.

More specifically, the organic colorant is selected from bis(4-diethylaminodithiobenzyl)nickel or bis(4-dimethylaminodithiobenzyl)nickel and when the solvent is a solution of poly(methmethacrylate) (PMMA), poly(vinylalcohol) or poly(vinyl acetate) or poly(styrene).

Generally speaking, for a microchip laser functioning at 1.06 μm, it is possible to use as an organic colorant bis(4-diethylaminodithiobenzyl)nickel (BND, Kodak, Case No 51449-18-4) in a solution of poly(methymethacrylate) (PMMA).

Accordingly, a solution containing in weight 6% of poly-(methymethacrylate) (PMMA, Polyscience mean masses?) in chlorobenzene (Prolabo) is prepared by being agitated for 24 hours. Added to this is 0.2% in weight of BDN and is agitated again for 2 hours. The solution is then filtered and placed on the substrate on the outlet face (opposite the inlet face which comprises the dichroic mirror) drop by drop with a centrifugal circular movement. For this "whirling" placing, it is possible to use a standard machine, such as the one used in microelectronics for placing resins used for litho-etching operations. The substrate is firstly cleaned to eliminate all traces of impurities resulting from polishing. It is then rotated (whirled) for 20 seconds at 2000 rpm and then for 30 seconds at 5000 rpm. The film is then dried for 2 hours in an oven at 70° C.

Thus, a film 1 μm thick is obtained containing 3% of active molecules (BND) and whose optical density is between 0.13 and 1.06 μm (74% of transmission) prior to saturation. This saturable absorbent has a relaxation time approaching 10 ns and saturates at an intensity approaching 1 MW/cm$^2$.

By varying the concentration parameters of the polymer, its molecular mass and its solvent, the colorant proportion and the speed of rotation of the whirling machine, it is possible to adjust the performances of the saturable absorbent. The typically specifications obtained are:

film thickness: 1 to 5 μm, molecule density: 5 to 10% in weight,
colorant: BDN, mm=685 g,
vitrous transition: Tg=78° C.,
absorption at 1.06 µm: 10 to 70%,
saturation percentage: 90%,
effective section: $10^{-16}$ cm2,
relaxation time: 2 to 15 ns,
saturation intensity: 0.1 to 1 MW/cm2,
film non-uniformity: <5% on 1 cm2,
depolarization rate $<10^{-5}$,
losses at 800 nm: <1%,
recurrence frequence: 10–10000 Hz,
photostability: $10^8$ strokes,
placing technique whirling.

Other polymers such as poly(vinylalcohol) or poly(vinylacetate) or even poly(styrene) may be used in their respective solvents instead of PMMA. It is also possible to use bis(4-dimethylaminodithiobenzyl)nickel (BND, Kodak, CASE No 38465-55-3)) as a colorant.

The colorant may also be incorporated in a silica gel or indeed transplanted on the polymer chain.

The technique may also be used for Q-switching lasers functioning on wavelengths other than 1.06 µm. For example, lasers shall be Q-switched with Er or ER+Yb (doped Er or Er+Yb materials where the active ion is Er) emitting around 1.5 µm with tetraethyloctahydrotetraazapentaphene-dithiolato-nickel.

With this type of placing, extremely short decline times are obtained for the colorant (down to 1 ns).

According to a second placing method, the thin film is obtained by liquid phase epitaxy (LPE). The LPE preparation method makes it possible to obtain on the substrate, constituted by the active solid medium, a film with a thickness of between 1 µm and 500 µm, such as 50 µm, 100 µm, 200 µm, 300 µm, 400 µm. It is formed of a basic material identical to the basic material of the active solid medium (for example YAG), but it is doped with ions providing it with saturable absorbent properties, for example $Cr^{4+}$ for a laser at 1.06 µm or $Er^{3+}$ for a laser around 1.5 µm.

In fact, the type for doping the laser it is desired to Q-switch is adapted so that the epitaxially-grown film exhibits a saturable absorption to the emission wavelength of this laser.

Accordingly, the active laser medium and the saturable absorbent film have the same crystalline structure and only differ via the various dopers which affect the crystalline and optical properties of these two media.

The S.A. (saturable absorbent) film is obtained by hardening the substrate on which it is placed in a suitable, selected super-saturated solution. This solution or epitaxy bath is a mixture of a solvent and a solute formed of various elements forming the final material.

This method can be applied to any existing material in the form of monocrystals (for the embodiment of substrates) and can be prepared by the liquid phase epitaxy method. This is the case for the substances mentioned above for the basic material of the active laser medium: $Y_3A_{15}O_{12}$ (YAG), $Y_2Si\theta_{05}$(YSO), $YVO_4$, $YLiF_4$ (YLF) or $GdVO_4$. The composition of the bath (choice of solvent and substituents), the concentrations in the solute of the various oxides and the experimental growth conditions (range of temperatures, mode of operation, etc) are adjusted for each material so as to obtain films exhibiting the best possible crystalline quality.

In the case of garnets (YAG), the selected solvent is a $PbO/B_2O_3$ mixture and the solute includes an excess of $Al_2O_3$ so as to stabilize the garnet. The solute/solvent ratio is then calculated so as to obtain a growth towards 1000° C.

Depending on the composition of the bath, the temperature and the placing time, it is possible to adjust the thickness ($1<e<200$ µm) and the concentration of dopers in the films. The growth of a film takes place at a constant temperature which makes it possible to obtain a homogeneous doping concentration as regards the thickness of the film. The substrate is driven with a uniform or alternate rotation which allows for good thickness homogeneity.

With this type of placing, the ions constituting the impurities ($Cr^{4+}Er^{3+}$) have decline times of about one microsecond.

The two placing methods described also make it possible to place a saturable absorbent thin film on a substrate which i then placed in contact with the amplifier medium. For example if the latter is YAG:Nd, the substrate may be an undoped YAG substrate.

Figure 10:
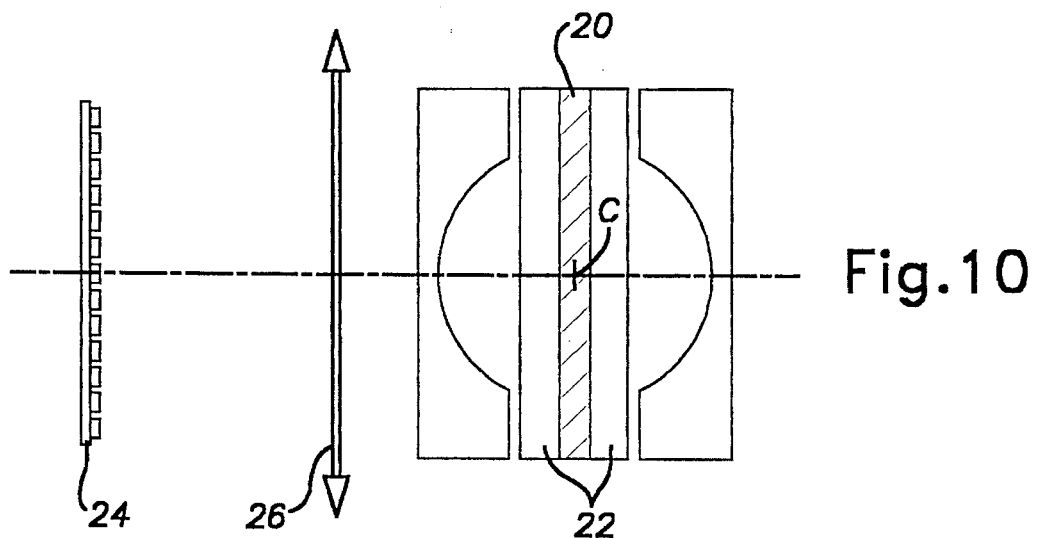
FIG. 10 shows an embodiment of the invention with a concentric standard cavity and an acousto-optical or electrooptical Q-switching cell.

FIG. 10 shows an embodiment of the invention with concentric cavity (for example with two spherical mirrors) when using an acousto-optical or electro-optical cell 20. The references 24 and 26 respectively represent a matrix of light sources and a focusing lens. The cell 20 is preferably placed close to the geometrical center C of the concentric cavity, the amplifier medium 22 able to be located on both sides of the Q-switching cell as on FIG. 10, or on merely one side. If on the other hand passive Q-switching is carried out with a saturable absorbent thin film, the position of the latter may be any inside the cavity of the microchip laser.

The use of a saturable absorbent in the form of a thin film is able to avoid the need to optically align the various components, introduce glue into the cavity and avoids any problems linked to a structure where the active medium is codoped with active laser ions and saturable absorbent ions.

Figure 11:
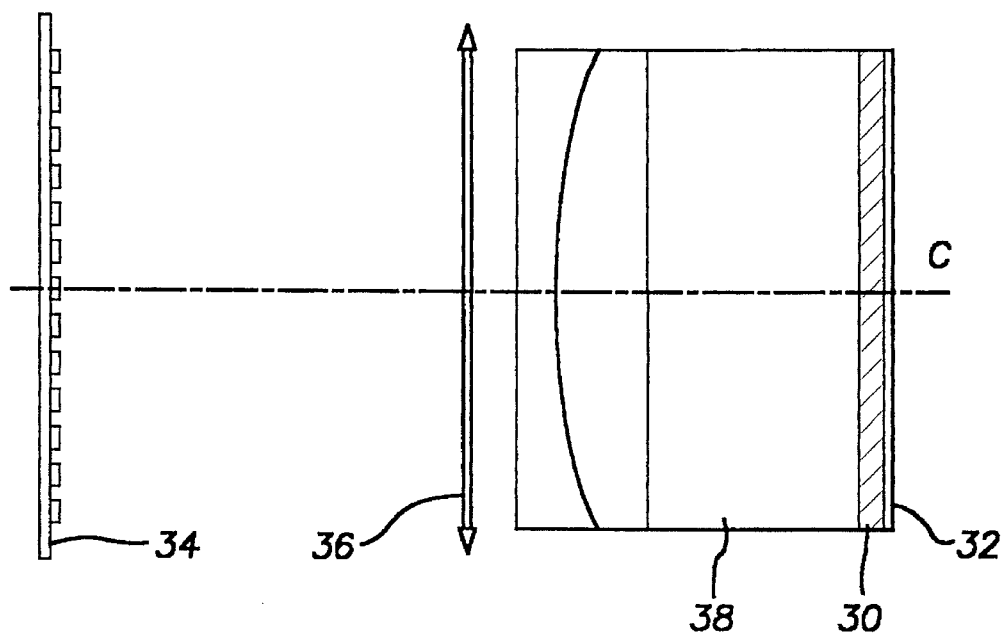
FIG. 11 shows another embodiment of the invention with a standard concentric cavity and with an acousto-optical or electro-optical Q-switching cell.

FIG. 11 shows an embodiment variant of the invention (where the outlet mirror is flat or slightly concave or convex): an acousto-optical or electro-optical cell 30 shall here be also favorably positioned close to the optical center C of the spherical mirror, that is immediately in front of the flat mirror 32. The references 34, 36 and 38 respectively denote the matrix of light sources, the focusing lens and the amplifier medium. As regards the saturable absorbent cell, this could be disposed in any position in the cavity, although in this configuration, the nearby positioning of the flat mirror seems more natural considering the collective mode for producing the microchip lasers.

In the case of microchip lasers, the methods described for embodying the various elements and for possible assembling the latter (amplifier medium, mirrors, Q-switching cell) are all collective methods, that is each method being able to embody the corresponding element in large quantities and thus at a lower cost.

Figure 12:
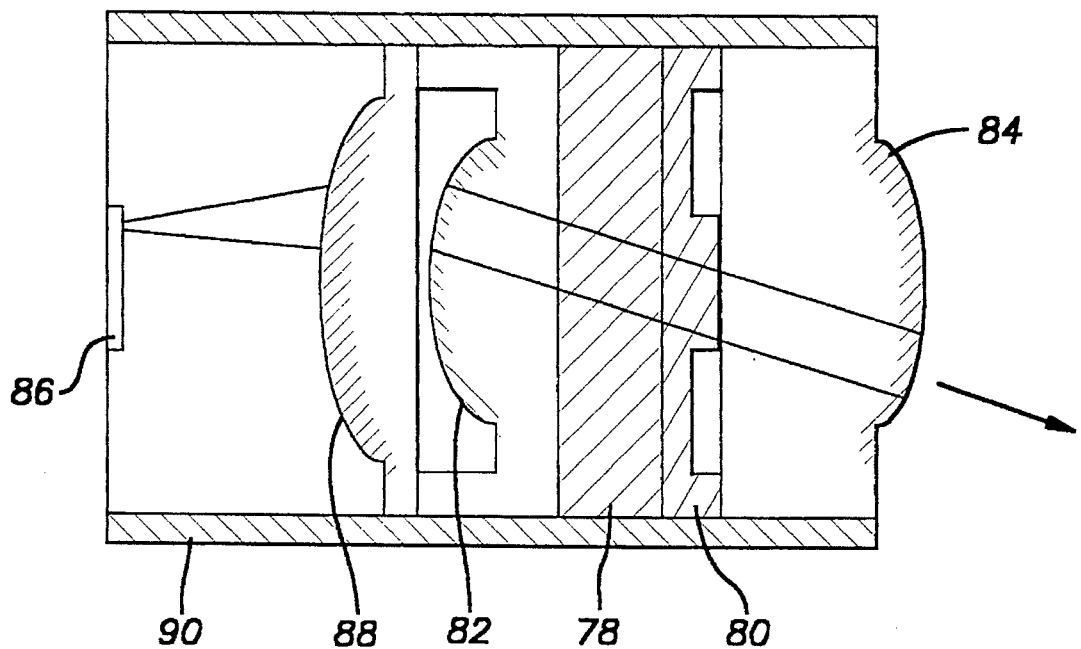
FIG. 12 shows an example for integrating a microchip laser in accordance with the invention.

One example for integrating a microchip laser with an amplifier medium (78), Q-switching cell (80), spherical mirrors (82, 84), pumping diode matrix 86 and collimation lens 88 is shown on FIG. 12.

All the above is incorporated in a housing 90. This figure does not show the electronic means for controlling the addressing of the pumping diode matrix and the Q-switching cell if the latter is an acousto-optical or electro-optical cell: an expert in this field would be able to select and adapt these means in each particular case.

The possibility of embodying these structures at lower cost seems extremely advantageous if it is intended to use said structures in motor vehicle applications (such as for detecting obstacles). Other application sectors also requiring small components at lower costs may be interested in these advantages; for example, "domotics" (for the orientation of small devices) or the environment (localized detection of pollutants or smoke zones, etc).

What is claimed is:

1. Microchip laser comprising: a resonant cavity having a solid amplifier medium, a spherical inlet mirror, and an outlet mirror, means for generating a pumping beam which optically pumps the solid amplifier medium, a saturable absorbent thin film for Q-switching the resonant cavity, said saturable absorbent thin film being disposed in the resonant cavity, and means for varying a direction of the pumping beam in the solid amplifier medium comprising a focusing lens having first and second focal points and being situated in a path of the pumping beam so that the second focal point is approximately merged with a center of curvature of the inlet mirror, the resonant cavity being adapted to generate a laser beam having a direction determined by the direction of the pumping beam.

2. Microchip laser according to claim 1 wherein the means for generating a pumping beam comprises a matrix of individually controllable light sources.

3. Microchip laser according to claim 1 wherein the means for generating a pumping beam comprises at least one light source and means to physically move said at least one light source.

4. Microchip laser according to claim 1 wherein the outlet mirror is spherical and has a center of curvature and wherein the centers of curvature of the inlet and outlet mirrors are approximately merged.

5. Microchip laser according to claim 1 wherein the outlet mirror is flat.

6. Microchip laser according to claim 1 wherein the means for generating a pumping beam comprises a small bar of individually controllable light sources.

7. Microchip laser according to claim 1 wherein the means for generating a pumping beam comprises a matrix of collectively controllable light sources.

8. Microchip laser according to claim 1 wherein the outlet mirror is slightly concave.

9. Microchip laser according to claim 1 wherein the outlet mirror is slightly convex.

10. Microchip laser comprising a resonant cavity having a solid amplifier medium, a cylindrical inlet mirror having an axis of cylindrical symmetry, an outlet mirror, means for generating a pumping beam which optically pumps the solid amplifier medium, a saturable absorbent thin film for Q-switching the resonant cavity, said saturable absorbent thin film being disposed in the resonant cavity, and means for varying the direction of the pumping beam in the amplifier medium comprising a cylindrical focusing lens having an axis of cylindrical symmetry and an image focal distance point in each plane perpendicular to the focusing lens' axis of cylindrical symmetry, said focusing lens being situated in a path of the pumping beam so that the axes of symmetry of the inlet mirror and the focusing lens are parallel to each other and, in any plane perpendicular to both axes of symmetry, the image focal distance point of the focusing lens is approximately merged with a center of curvature of the inlet mirror, the resonant cavity being adapted to generate a laser beam having a direction determined by the direction of the pumping beam.

11. Microchip laser according to claim 10 wherein the outlet mirror is cylindrical and has an axis of cylindrical symmetry and wherein the image focal distance point of the focusing lens is approximately merged with the centers of curvature of the inlet and outlet mirrors in any plane perpendicular to the axes of symmetry of both the inlet mirror and the focusing lens.

12. Microchip laser according to claim 10 wherein the outlet mirror is flat.

13. Microchip laser according to claim 10 wherein the outlet mirror is slightly concave and has an axis of cylindrical symmetry that is parallel to the axis of symmetry of the inlet mirror.

14. Microchip laser according to claim 10 wherein the outlet mirror is slightly convex and has an axis of cylindrical symmetry that is parallel to the axis of symmetry of the inlet mirror.

15. Microchip laser according to claim 10 wherein the means for generating a pumping beam comprises a matrix of individually controllable light sources.

16. Microchip laser according to claim 10 wherein the means for generating a pumping beam comprises a matrix of collectively controllable light sources.

17. Microchip laser according to claim 10 wherein the means for generating a pumping beam comprises at least one light source and means to physically move said at least one light source.

18. Microchip laser according to claim 10 wherein the means for generating a pumping beam comprises a small bar of individually controllable light sources.

19. Microchip laser according to claim 1 wherein the means for generating a pumping beam comprises a small bar of collectively controllable light sources.

20. Microchip laser according to claim 10 wherein the means for generating a pumping beam comprises a small bar of collectively controllable light sources.

* * * * *